United States Patent
Neel et al.

(10) Patent No.: US 11,467,199 B2
(45) Date of Patent: Oct. 11, 2022

(54) SERIES REDUNDANT CAPACITIVE SENSING DEVICE

(71) Applicant: FOGALE NANOTECH, Nîmes (FR)

(72) Inventors: Christian Neel, Nîmes (FR); Didier Roziere, Nîmes (FR)

(73) Assignee: FOGALE NANOTECH, Nîmes (FR)

( * ) Notice: Subject to any disclaimer, the term of this patent is extended or adjusted under 35 U.S.C. 154(b) by 67 days.

(21) Appl. No.: 17/053,461

(22) PCT Filed: Feb. 25, 2019

(86) PCT No.: PCT/EP2019/054608
§ 371 (c)(1),
(2) Date: Nov. 6, 2020

(87) PCT Pub. No.: WO2019/219254
PCT Pub. Date: Nov. 21, 2019

(65) Prior Publication Data
US 2021/0231718 A1    Jul. 29, 2021

(30) Foreign Application Priority Data
May 15, 2018 (FR) .................................. 1854039

(51) Int. Cl.
*G01R 27/26* (2006.01)
*H03K 17/955* (2006.01)

(52) U.S. Cl.
CPC ....... *G01R 27/2605* (2013.01); *H03K 17/955* (2013.01); *H03K 2217/960705* (2013.01); *H03K 2217/960745* (2013.01)

(58) Field of Classification Search
USPC ................................ 324/660–663, 679, 686
See application file for complete search history.

(56) References Cited

U.S. PATENT DOCUMENTS

| | | | |
|---|---|---|---|
| 6,370,960 B1 | 4/2002 | Igel et al. | |
| 9,513,321 B2 | 12/2016 | Frangen | |
| 2013/0207677 A1 | 8/2013 | Togura et al. | |
| 2017/0147141 A1 | 5/2017 | Khazeni et al. | |
| 2020/0271608 A1* | 8/2020 | Neel ...................... G01R 17/10 |

OTHER PUBLICATIONS

French Search Report received for French Application No. 1854039 dated Feb. 1, 2019.
International Search Report and Written Opinion Received for PCT/EP2019/054608 dated May 20, 2019.

* cited by examiner

*Primary Examiner* — Vincent Q Nguyen
(74) *Attorney, Agent, or Firm* — Greer, Burns & Crain, Ltd

(57) ABSTRACT

A device for capacitive detection of an object with respect to a detection surface, including:
  at least one capacitive detection electrode, and
  detection electronics including at least one item of measurement electronic equipment, for:
  polarizing the at least one detection electrode at an alternating excitation potential (VG), different from a ground potential;
  measuring a measurement signal relative to an electrode-object capacitance; and the detection electronics also includes, for the measurement electronics, at least two separate calculation modules, operating in parallel, and supplying two independent detection signals for one and the same measurement signal originating from the measurement electronics.

19 Claims, 4 Drawing Sheets

SERIES REDUNDANT CAPACITIVE SENSING DEVICE

BACKGROUND

The present invention relates to a device for redundant capacitive detection of an object. It also relates to a detection layer fitted with such a detection device and an item of equipment fitted with such a device or such a layer.

The field of the invention is, non-limitatively, that of interfaces for the capacitive detection of objects in order to detect objects in an environment or in contact with a detection surface.

A first capacitive detection technique is known based on the mutual capacitance formed between two measurement electrodes. A second capacitive detection technique is also known based on the capacitance formed between the object to be detected and a measurement electrode. The invention relates to this second capacitive detection technique.

In general, capacitive detection devices can be used in fields having increased or critical risks. This is the case, for example, in fields where an operator works alongside a robot. It is essential to ensure that the robot does not collide with the operator, due to a malfunction of the capacitive detection device equipping the robot.

This requirement can be met by providing redundant capacitive detection in the detection device equipping the robot, as provided for in document U.S. Pat. No. 9,513,321. The latter provides for using, for each detection location/pixel, two pairs of electrodes, each pair of electrodes carrying out a measurement independently of the other pair of electrodes. Thus, when a pair of electrodes suffers a malfunction, the detection is still ensured by the remaining pair.

However, the solution described in this document is costly and bulky because it requires the use of a significant number of electrodes. In addition, the solution proposed in this document is sensitive to mutual interference between the pairs of electrodes and requires means for isolating pairs of electrodes, or the use of pairs of electrodes in turn.

An aim of the present invention is to overcome the aforementioned drawbacks.

Another aim of the present invention is to propose a redundant capacitive detection device that is simpler, less costly and less bulky Another aim of the present invention is to propose a redundant capacitive detection device having an increased sensitivity allowing detection of objects at a greater distance.

Yet another aim of the present invention is to propose a capacitive detection device limiting the electronic components used for the detection.

SUMMARY

At least one of these aims is achieved with a device for capacitive detection of an object with respect to a detection surface, comprising:
  at least one capacitive detection electrode, and
  detection electronics comprising at least one item of electronic equipment, called measurement electronics, for:
    polarizing said at least one detection electrode at an alternating potential, called excitation potential, different from a ground potential, and
    measuring a signal, called measurement signal, relative to a capacitance, called, electrode-object capacitance, between each detection electrode and said object;
characterized in that the detection electronics also comprises, for said at least one measurement electronics, at least one first and one second separate calculation modules, operating in parallel, and supplying at least two independent detection signals for one and the same measurement signal originating from the measurement electronics.

Thus, the detection device according to the invention makes it possible to obtain, for each detection location of a detection surface, redundant detection signals by independent calculation modules mounted in parallel, with a single measurement electronics, which reduces the number, the cost and the bulk of the detection electronics used, and thus of said detection device.

In addition, for each detection location of a detection surface, the capacitive detection can be carried out with a single measurement electrode, which is simpler, less costly and less bulky compared with the devices of the state of the art, and in particular with that described in document U.S. Pat. No. 9,513,321. Moreover, the redundant detection signals can be obtained simultaneously.

Furthermore, the capacitive detection is based on the measurement of a signal relative to the electrode-object capacitance between a detection electrode and the object, which makes it possible to carry out a detection with high sensitivity and at a greater distance, in particular in comparison with the device of document U.S. Pat. No. 9,513,321.

In the present invention, the signal relative to an electrode-object capacitance supplied by the measurement electronics can be, or comprise, for example, a signal relative to said capacitance, or an inverse of said capacitance, or also relative to a distance and/or a contact between an object and an electrode.

In the present description, for the sake of brevity, the term "ground potential" denotes a reference potential of the electronics, which can be for example an electrical earth or a ground potential. This ground potential can correspond to an earth potential, or to another potential, connected or not to the earth potential.

In the present application, two alternating potentials are identical at a given frequency when they each comprise an alternating component identical at this frequency. Thus, the at least one of the two identical potentials at said frequency can also comprise a direct component, and/or an alternating component having a frequency different from said given frequency.

Similarly, two alternating potentials are different at the working frequency when they do not have an identical alternating component at this working frequency.

In the present invention, the spatial resolution of the detection device is determined by the dimension of the detection locations or of the capacitive detection electrodes, and/or their spacing (for example from centre to centre).

The measurement electronics supplies a measurement signal representing the electrode-object capacitance. The measurement signal can in particular be an electrical potential, or a digital signal representing a voltage, measured by the measurement electronics.

Each of the first and second calculation modules can then supply a detection signal representing a distance or an item of distance information, and/or a contact or an item of contact information, between the object and said at least one detection electrode. The detection signal can in particular be or comprise any one of the following signals, deduced from the measurement signal supplied by the measurement electronics:

- a signal relative to the measured electrode-object capacitance;
- a signal relative to the measured electrode-object distance;
- a signal relative to a contact between the electrode and the object;
- a signal relative to a comparison between said measured electrode-object capacitance and a predetermined threshold capacitance;
- a signal relative to a comparison between said measured electrode-object distance and a predetermined threshold distance; or
- an alarm signal deduced as a function of one of said comparisons.

The calculation of the distance and/or contact can in particular be carried out by taking into account the measurement signal supplied by the measurement electronics, or as a function of a digital version of said measurement signal, or of another digital or analogue signal deduced from said measurement signal, for example by filtering or demodulation of said measurement signal at the working frequency.

Each of the first and second calculation modules can determine said detection signal, or for example said distance, or said contact, by calculation or by comparison with a previously established reference table.

Each of the first and second calculation modules can also determine said detection signal, or for example said distance, or said contact, directly as a function of a previously provided relationship.

The distance or contact information can for example also be, or comprise, an item of comparison information with respect to one or a plurality of distance thresholds. It can then be used for example to trigger safety procedures, such as for example slowing, or stopping, or an avoidance procedure, of a machine or a robot when an obstacle or a human operator is located at a distance below a threshold.

Moreover, each of the first and second calculation modules can supply a detection signal comprising one and the same item of information, but determined in a way or according to procedures that are different for each calculation module.

According to an embodiment, the detection device according to the invention can also comprise a third calculation module, placed between the at least one measurement electronics and said first and second calculation modules, and carrying out a processing of the measurement signal supplied by said measurement electronics.

This third calculation module supplies a signal identical to each of the first and second calculation modules.

This third calculation module can carry out a processing of the measurement signal supplied by the measurement electronics. This processing can comprise a shaping, a demodulation, etc. of the signal measured by the measurement electronics.

This third calculation module can also carry out a part of the calculations described above to determine the detection signals, namely, for example, a calculation of any one of the following signals:

- a signal relative to the measured electrode-object capacitance;
- a signal relative to the measured electrode-object distance;
- a signal relative to a contact between the electrode and the object;
- a signal relative to a comparison between said measured electrode-object capacitance and a predetermined threshold capacitance; or
- a signal relative to a comparison between said measured electrode-object distance and a predetermined threshold distance.

Each of the first, second and third calculation modules can be, or comprise, all types of circuits or electronic, analogue and/or digital elements. They can for example be constituted by, or comprise, a microprocessor, a chip, an FPGA, etc. or even a simple logical element such as a comparator.

Advantageously, the detection electronics can also comprise a control module arranged to compare the detection signals supplied by the first and second calculation modules.

The function of this control module is to make sure that the first and second calculation modules supply one and the same result for each detection electrode. If this is not the case, there is then a malfunction in the detection device.

The control module can thus supply:

- a signal for comparing the signals supplied by the first and second calculation modules, or
- an alarm signal when said comparison observes a difference between the signals supplied by the first and second calculation modules.

The control module can be an electronic and/or digital module separate from the other modules.

The control module can be a microprocessor, a chip, an FPGA, etc.

The control module can alternatively be produced from components or functionalities, implemented in one, or each, of the first and second calculation modules.

Thus, the control module can for example be implemented in the first and second calculation modules, in the form of two independent control sub-modules. Each sub-module compares a signal originating from the control module in which it is implanted with the signal originating from the other calculation module. This arrangement allows optimal operational redundancy and safety since each calculation module is monitored by two independent control sub-modules.

The control module can be arranged for example to compare the distances, or the items of distance and/or contact information, supplied by the first and second calculation modules.

The control module can in particular determine differences between the signals issued respectively from the calculation modules and thus detect failure of in the detection device according to the invention. It can also be used for example to trigger safety procedures, such as for example slowing, or stopping, in the case of detection of a difference between signals above (or below) a predetermined threshold.

According to a particularly advantageous version, the detection electronics can comprise at least one capacitance, called reference capacitance, used to verify and/or calibrate the operation of the at least one measurement electronics and/or of at least one calculation module.

This reference capacitance is measured by the detection electronics in the same way as an electrode-object capacitance between a detection electrode and an object.

Such a reference capacitance makes it possible to carry out a calibration of the different elements of the device according to the invention as the value thereof is known.

Above all, such a reference capacitance makes it possible to detect a malfunction which could occur at the level of the measurement electronics, or of each calculation module.

For example, if for the reference capacitance, the first and second calculation modules supply two identical but erroneous results, then it is highly possible that the measurement electronics is faulty. On the other hand, if one of the calculation modules supplies an erroneous result while the other supplies a correct result, this indicates a failure at the level of said other calculation module.

Such a reference capacitance can be formed by a capacitor having a predetermined value. Alternatively, such a reference capacitance can be formed by an electronic component simulating said capacitance.

The measurement of the capacitance or capacitances can be carried out during a sequence, called verification sequence.

The verification sequence can be carried out:
each time the detection device is powered up, and/or
before and/or after each measurement by a detection electrode within a set of detection electrodes, and/or
before and/or after each measurement sequence of a plurality of detection electrodes, and/or
on request, etc.

Several reference capacitances can be used, for example to verify or calibrate a gain and an offset of the measurement electronics, and/or to introduce a redundancy in the measurement of these reference capacitances.

The device according to the invention can also comprise at least one electrode, called guard electrode, to guard at least one detection electrode, said at least one guard electrode being polarized at an alternating guard potential identical or substantially identical to the excitation potential at at least one working frequency, at least during measurement of a measurement signal relative to an electrode-object capacitance.

Such a guard electrode can be placed for example opposite a face of at least one detection electrode, or in proximity to said at least one detection electrode. It makes it possible to electrically guard the detection electrode and thus increase the detection range and accuracy of the detection, by protecting said detection electrode from parasitic coupling capacitances in particular.

The guard electrode or electrodes can be:
individual at each detection electrode, optionally with one or more guard electrodes per detection electrode; or
common to a plurality, or all, of the detection electrodes, optionally with one or more guard electrodes per detection electrode.

According to a particularly advantageous non-limitative characteristic, the device according to the invention can comprise, for at least one detection electrode, at least one electrode, called test electrode, arranged to verify, during a verification sequence, the operation of said detection electrode by:
polarizing said test electrode and said detection electrode at electric potentials different to at least one working frequency, and
measuring a signal relative to the capacitance, called test signal, between said test electrode and said detection electrode.

Thus, the detection device according to the invention proposes, in addition to the correct operation of the measurement electronics and of the calculation modules, verification of the correct operation of each detection electrode (or of at least a part of the detection electrodes).

When a detection electrode is failing, then this failure can be detected as a function of the value of the test capacitance between said detection electrode and the test electrode. To this end, the signal relative to the test capacitance is used to carry out a comparison with a predetermined value corresponding to said test capacitance.

The verification sequence associated with the test electrode, or with a set of test electrodes corresponding to detection electrodes, can be that described above for the reference capacitance. In this case, reference capacitance and test capacitance measurements can be carried out during one and the same verification sequence.

Alternatively, the verification sequence associated with one or more of the test electrodes can be separate from the verification sequence associated with the test capacitance.

In general, the verification sequence associated with one or a plurality of test electrodes can be carried out:
each time the device is powered up, for all or part of the test electrodes, and/or
before and/or after a measurement by a detection electrode within a set of detection electrodes, at least for the corresponding test electrode, and/or
before and/or after each measurement sequence of a plurality of detection electrodes, for all or part of the test electrodes, and/or
on demand, etc.

It should be noted that the use of reference capacitances and/or test electronics and the carrying out of associated verification sequences as described above are necessary to fulfill the safety requirements, while implementing a separate measurement electronics for each electrode. In fact, this makes it possible to verify the correct operation of this electronics and of the detection electronics, regularly or even between each measurement, to ensure that no incorrect measurement is transmitted in the case of failure of these elements.

The invention furthermore comprises at least two calculation modules to be able to supply at least two separate detection signals with the associated failure diagnostics. This redundancy at the level of the outputs is necessitated by the need to guard against failure of the higher-level supervision elements.

The invention thus achieves an optimal compromise between safety requirements and a necessary limitation of the costs and the bulk associated with the duplication of modules. It also makes it possible to poll all of the electrodes in a secure and redundant manner to make best use of the spatial resolution supplied by these electrodes.

Advantageously, for at least one detection electrode, at least one test electrode can be formed by a guard electrode, or a part of a guard electrode, associated with said detection electrode.

Thus, it is not necessary to provide an additional layer of electrodes to produce the test electrodes, which reduces the cost, the bulk and the complexity of the device according to the invention.

The device according to the invention can comprise a means for modifying the polarization of the at least one test electrode, respectively of the at least one detection electrode, between a measurement sequence and a verification sequence, so as to polarize said at least one electrode:
during a verification sequence: at a first electrical potential different from the excitation potential at at least one working frequency, and
during a measurement sequence: at a second alternating potential, identical or substantially identical to said excitation potential at at least one working frequency, or corresponding to said excitation potential.

In other words, the test electrode and the detection electrode are polarized at one and the same potential during a measurement sequence and at different potentials during a verification sequence.

The second potential can be the guard potential, in particular when the test electrode is constituted by a part, or all, of a guard electrode.

According to a particular embodiment, the means for modifying the polarization can comprise a voltage source or an oscillator.

It can also comprise an electrical switch making it possible to switch the polarization of the test electrodes and/or of the measurement electrodes between a verification sequence and a measurement sequence.

According to embodiments, the device according to the invention can comprise a means for modifying the polarization of the at least one test electrode, for example in the form of an electrical switch or an oscillator. In this case, the polarization of the at least one detection electrode can remain unchanged between a measurement sequence and a verification sequence.

According to other embodiments, the device according to the invention can comprise a means for modifying the polarization of the at least one detection electrode, for example in the form of an electrical switch or an oscillator. This modification of the polarization can be carried out directly or via the measurement electronics. In this case, the polarization of the at least one test electrode (corresponding to a guard electrode) can remain unchanged between a measurement sequence and a verification sequence.

In an embodiment, the first potential can be the ground potential.

In an embodiment, the first potential can be a potential identical to the excitation potential, but having a different amplitude. The first potential can thus be for example a potential of the same frequency and of the same waveform as the excitation potential, but having a lower amplitude, between the ground (zero amplitude) and the amplitude of the excitation potential.

The measurement electronics can comprise a polling means to poll at least a part of the detection electrodes, sequentially.

Thus, the architecture of the detection electronics is simplified.

Such a polling means can comprise a switch connecting the detection electronics, sequentially or in turn, to each detection electrode, or to each group of detection electrodes.

This switch can also be arranged so as to connect the detection electrodes respectively, either to the detection electronics, or to the guard potential. Thus, the detection electrodes which are not connected to the detection electronics, and are thus in the non-measuring state, behave as guard elements with respect to measuring detection electrodes in the measuring state.

The measurement electronics can also comprise a polling means or a switch (identical or different) to poll the reference capacitances. In this case, as above, this switch can also be arranged so as to connect the non-measuring detection electrodes to the guard potential.

Moreover, the detection electronics can comprise a plurality of measurement electronics, each being arranged to poll a detection electrode, or a plurality of detection electrodes via a polling means, and where necessary, one or more reference capacitances.

In this case:
each measurement electronics is arranged to poll one or more separate detection electrodes;
each measurement electronics is connected, directly or indirectly, to at least one first and one second separate calculation module.

In general, the detection electronics can be digital, or analogue, or also a combination of digital and analogue means.

According to an embodiment, the at least one measurement electronics can comprise an operational amplifier (OA), or a circuit forming an operational amplifier, functioning as a transimpedance or charge amplifier, in which:
a first input, for example an inverting input, is connected to one or more detection electrodes, directly or via a polling means;
a second input, for example a non-inverting input, is connected to an oscillator supplying an excitation signal;
the output is looped on said first input via an impedance, and in particular via a capacitor.

In this configuration, the output of the OA supplies a voltage $V_s$, the amplitude of which is proportional to a capacitance, namely:
la electrode-object capacitance seen by a detection electrode, during a measurement phase,
the test capacitance seen by a detection electrode during a verification sequence using a test electrode, and
the reference capacitance during a verification sequence using the reference capacitance.

The output of the operational amplifier can be connected, directly or indirectly, to a module for measuring the voltage $V_s$, which is itself connected to one or more calculation modules, such as the calculation module or modules described above.

This module for measuring the voltage $V_s$ can comprise a demodulation, such as a synchronous demodulation at a working frequency of the alternating excitation potential, or an amplitude detection.

The detection electronics, and in particular the measurement electronics can, at least partially, be electrically referenced to the alternating excitation potential.

Thus, the detection electronics does not introduce parasitic capacitances that are visible by the detection electrodes, which increases the detection accuracy.

The device according to the invention can also comprise an oscillator supplying the alternating excitation potential, and the guard potential if required.

Each detection electrode carries out a capacitive detection for a detection location of the detection surface.

At least one, in particular each, detection electrode can be formed by a single measurement electrode.

According to an advantageous optional characteristic, at least one, in particular each, detection electrode can comprise at least one first and one second independent electrodes, called measurement electrodes.

Thus, the device according to the invention makes it possible to provide a greater detection redundancy for each detection location.

Each of the measurement electrodes of a detection electrode can be polled sequentially, by one and the same measurement electronics.

The measurement electrodes of a detection electrode can also be polled in parallel, by separate measurement electronics.

In particular, the measurement electronics can be common to all of the measurement electrodes of a detection electrode. In this case, the measurement electronics can comprise a polling means connecting each of the measurement electrodes to the measurement electronics in turn.

According to another embodiment, the device according to the invention can comprise a first common measurement electronics for all or parts of the first measurement electrodes, and a second common measurement electronics for all or part of the second measurement electrodes. In this case, the detection device comprises two separate measurement electronics, one dedicated to the first measurement electrodes and the other dedicated to the second measurement electrodes.

According to embodiments, for at least one detection electrode:
the first and second measurement electrodes can be juxtaposed in a non-interleaved manner, or
one of the first and second measurement electrodes can be at least partially interleaved with the other of said measurement electrodes; or
the first and second measurement electrodes can be at least partially interleaved with one another.

The detection, and/or guard, and/or test electrode or electrodes can be produced from any conductive material. They can in particular be produced with deposition or a metal layer. They can also be produced with techniques of the multiwiring type and/or deposition on a textile support.

Alternatively, at least one, in particular each, of the electrodes can be produced from a transparent material, such as indium tin oxide (or ITO).

According to yet another aspect of the invention, a detection layer is proposed for an item of equipment, fitted with a detection device according to the invention.

The detection device according to the invention, in particular the detection electrodes, is(are) able to be integrated in the detection layer.

The detection layer can be integrated in the item of equipment.

Alternatively, the detection layer can be independent of the item of equipment and attached to this item of equipment in a removable or detachable manner.

According to an embodiment, the detection layer according to the invention can comprise, along a face, a plurality of detection electrodes. These detection electrodes can be distributed in a matrix arrangement.

According to another embodiment, the detection layer according to the invention can comprise:
along a face, at least one detection electrode, and
along another face, at least one guard electrode and/or at least one test electrode.

The detection layer can comprise a resilient dielectric layer, such as a printed circuit board substrate, supporting along one or both of the faces, electrodes in the form of depositions or metal layers.

The detection layer can of course comprise protection or trim layers over the detection and/or guard and/or test electrodes.

The detection layer can have the form of a rigid or resilient trim element.

The detection layer can have the form of a trim element or a skin, or a textile trim.

The detection layer can also have the form of a trim part or element that is tubular in shape, such as for example a casing or a cover.

According to another aspect of the same invention, an item of equipment fitted with a detection device according to the invention, or a detection layer according to the invention, is proposed.

The item of equipment can have for example the form of a fixed or mobile robot, of humanoid shape or other, or in the form of a robotized handling arm, or a robot arm or a robot segment, or also of an autonomous vehicle (AGV).

According to embodiments, the detection device, respectively the detection layer, can be integrated in a component part of the item of equipment, such as a casing or a cover.

Alternatively, the detection device, respectively the detection layer, can be independent from a component part of the equipment and be placed in/on a component part of said equipment in a detachable or removable manner.

BRIEF DESCRIPTION OF THE DRAWINGS

Other advantages and characteristics will become apparent on examination of the detailed description of examples that are in no way limitative, and from the attached drawings, in which.

DETAILED DESCRIPTION

It is well understood that the embodiments that will be described hereinafter are in no way limitative. Variants of the invention can in particular be envisaged comprising only a selection of characteristics described hereinafter in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described can be combined together if there is no objection to this combination from a technical point of view.

In the figures, elements common to several figures keep the same reference.

Figure 1:
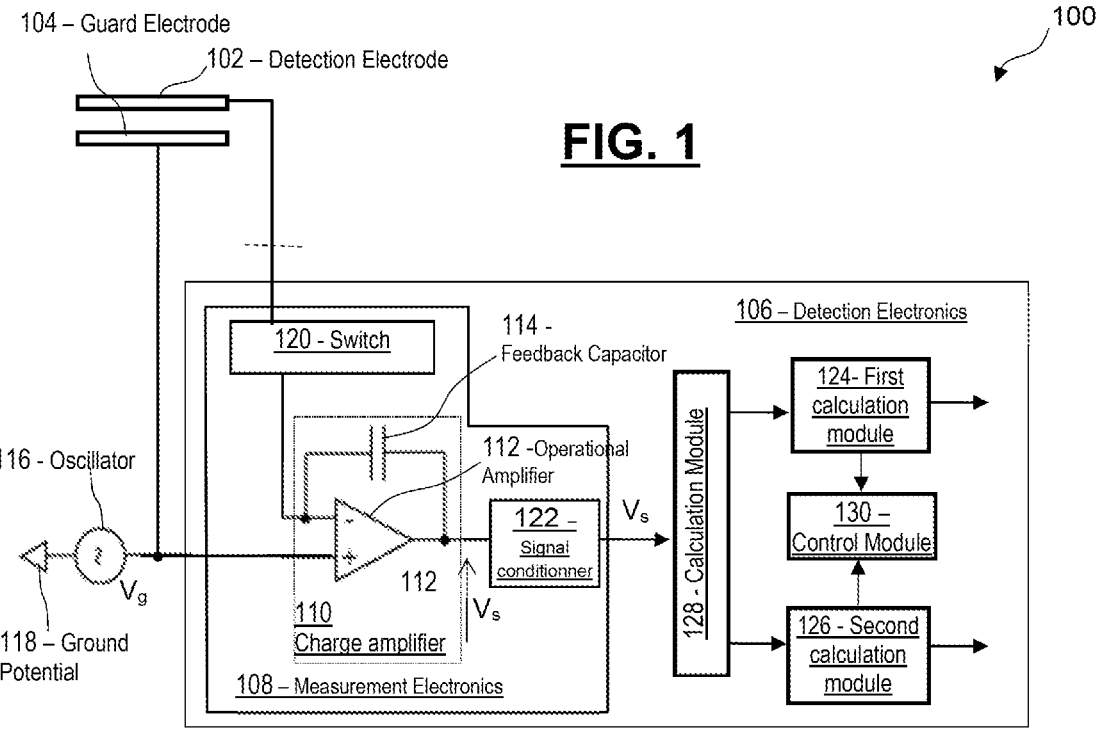
FIGS. 1-5 are diagrammatic representations of five non-limitative embodiment examples of a capacitive detection device according to the invention.

FIG. 1 is a diagrammatic representation of a first non-limitative embodiment example of a capacitive detection device according to the invention.

The detection device 100, shown in FIG. 1, can be produced in an analogue or digital form, or an analogue/digital combination.

The detection device 100 comprises several capacitive detection electrodes 102, only one of which is shown in FIG. 1 for the sake of clarity.

The detection device 100 also comprises one or more guard electrodes 104, to electrically guard said detection electrodes 102. Similarly, a single guard electrode is shown in FIG. 1 for the sake of clarity.

The device 100 can comprise a single guard electrode 104 forming a guard plane common to several, or all, the detection electrodes 102, or an individual guard electrode 104 for each detection electrode.

The detection device 100 also comprises detection electronics 106. The detection electronics 106 comprises in particular a measurement electronics 108 connected to the detection electrode 102 and to the guard electronics 104.

The measurement electronics 108 comprises a current, or charge, amplifier 110 represented by an operational amplifier (OA) 112 and a feedback capacitor 114 looping the output of the OA 112 to the inverting "−" input of the OA 112.

An oscillator 116, referenced to a ground potential 118, supplies an alternating excitation voltage, denoted $V_G$. This alternating excitation voltage is also used as a guard potential in order to polarize the guard electrodes 104.

In the example shown, the non-inverting "+" input of the OA 112 receives the voltage $V_G$ and the inverting "−" input of the OA 112 is provided to be connected to each detection electrode 102 via a polling means 120, which can be for example a switch, so as to poll a set of "n" detection electrodes 108 individually in turn. The switch 120 is also arranged to connect the detection electrodes 102, either to the OA, or to the guard potential.

Under these conditions, the charge amplifier 110, and in particular the OA 112, supplies at the output a voltage $V_s$ at an amplitude proportional to the coupling capacitance $C_{eo}$, called electrode-object capacitance, between the detection electrode 102 connected to the "−" inverting input thereof and an object in proximity to, or in contact with, said detection electrode 102.

The measurement electronics 108 can also optionally comprise a signal conditioner 122 making it possible to obtain a signal representative of the sought coupling capacitance $C_{eo}$. This signal conditioner 122 can comprise, for example, a synchronous demodulator for demodulating the signal with respect to a carrier wave, at a working frequency. The signal conditioner 122 can also comprise an asynchronous demodulator or an amplitude detector. This signal conditioner 122 can of course be produced in an analogue and/or digital form (microprocessor), and comprise all necessary means for filtering, conversion, processing etc.

The signal conditioner 122 measures and supplies the value of the voltage $V_S$.

The detection electronics 106 comprises, for the measurement electronics 108, at least one first calculation module 124 and one second calculation module 126 that are separate, operating in parallel, and supplying at least two independent detection signals for one and the same measurement signal originating from the measurement electronics 108.

A third, optional, calculation module 128, can be placed between the measurement electronics 108, and the first and second calculation modules 124 and 126.

Each calculation module 124-128 can be produced by, or comprise, a microprocessor, or a chip (FPGA), or independent logic elements (comparators, etc.).

The detection electronics 106 also comprises a control module 130 arranged to carry out a comparison of the signals supplied by the first and second calculation modules 124 and 126, and to verify the correct operation of the detection device 100. The control module 130 can transmit an alarm signal or a safety signal in case of failure of the detection device 100.

In the example shown in FIG. 1, the control module 130 can be formed by an independent processor, or a chip.

As specified above, the measurement electronics 108 supplies at the output a voltage value $V_s$, or an equivalent variable, in numerical form.

According to a first embodiment, the first, second and third calculation modules 124-128 can be arranged to carry out the following operations:

from the signal supplied by the measurement electronics 108, the third calculation module 128 calculates a distance value between an object and the detection electrode 102, and supplies this distance value to the calculation modules 124 and 126; and independently, each calculation module 124 and 126 compares this distance to a threshold distance value corresponding to a safety distance or a contact between the detection electrode 102 and an object, and supplies a signal relative to the crossing of said safety distance or to said contact. This signal can be an analogue, numerical signal, or a closing or opening of a relay.

According to a second embodiment, the first, second and third calculation modules 124-128 can be arranged to carry out the following operations:

from the signal supplied by the measurement electronics 108, the third calculation module 128 calculates a capacitance value between an object and the detection electrode 102, and supplies this capacitance value to the calculation modules 124 and 126; and independently, each calculation module 124 and 126 compares this capacitance value to a threshold capacitance value corresponding to a safety distance or a contact between the detection electrode and an object, and supplies a signal relative to the crossing of said safety distance or to said contact. This signal can be an analogue, numerical signal, or a closing or opening of a relay.

According to a third embodiment, the first, second and third calculation modules 124-128 can be arranged to carry out the following operations:

from the signal supplied by the measurement electronics 108, the third calculation module 128 calculates a capacitance value between an object and the detection electrode 102, and supplies this capacitance value to the calculation modules 124 and 126; and independently, each calculation module 124 and 126:

calculates a distance value from the capacitance value supplied by the third calculation module 128; and compares this distance value to a threshold distance value corresponding to a safety distance or a contact between the detection electrode 102 and an object, and supplies a signal relative to the crossing of said safety distance or to said contact. This signal can be an analogue, numerical signal, or a closing or opening of a relay.

According to another embodiment example, the detection device 100 may not comprise a third calculation module 128. The first and second calculation modules 124-126 can be arranged to carry out the following operations:

from the signal supplied by the measurement electronics 108, each calculation module 124 and 126 independently calculates a distance value between an object and the detection electrode 102, compares this distance to a threshold distance value corresponding to a safety distance or a contact between the detection electrode 102 and an object, and supplies a signal relative to the crossing of said safety distance or to said contact. This signal can be an analogue, numerical signal, or a closing or opening of a relay.

The detection electronics 106, or at least its sensitive part with the charge amplifier 110, can be referenced (or supplied by electrical power supplies referenced) to the guard potential $V_G$, in order to minimize the parasitic capacitances.

The detection electronics 106 can also be referenced, more conventionally, to the ground potential 118.

Figure 2:
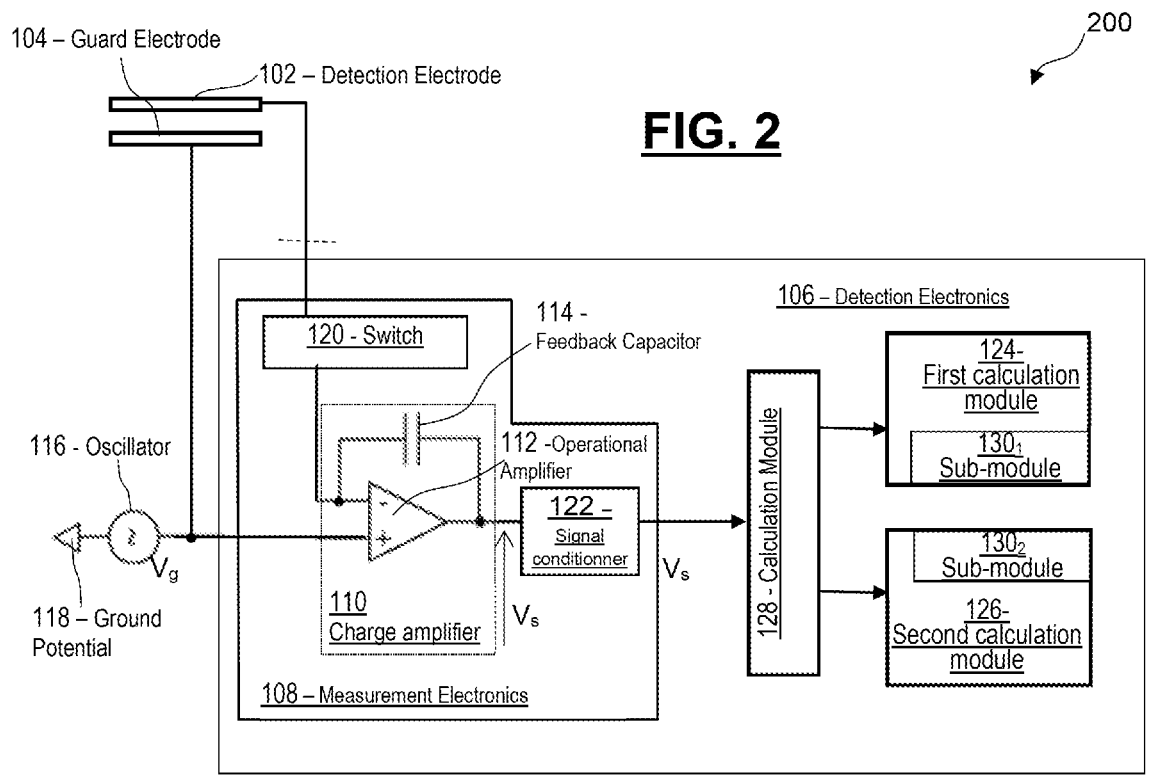

FIG. 2 is a diagrammatic representation of a second non-limitative embodiment example of a capacitive detection device according to the invention.

The detection device 200, shown in FIG. 2, comprises all the elements of the device 100 in FIG. 1, except the control module 130.

Unlike the device 100, in the device 200 the control module has the form of two subassemblies $130_1$ and $130_2$. The sub-module $130_1$ is integrated in the first calculation module 124 and the sub-module $130_2$ is integrated in the second calculation module 126.

Each sub-module $130_1$-$130_2$ communicates with the other sub-module $130_1$-$130_2$ to transmit thereto the signal calculated by the calculation module 124-126 in which it is integrated. Each sub-module $130_1$-$130_2$ compares the signal originating from the control module 124-126 in which it is implanted with the signal originating from the other calculation module 124-126. The control sub-module $130_1$-$130_2$ (or the first calculation module 124 and/or the second calculation module 126) can transmit an alarm signal or a safety signal in case of failure of the detection device 100. This arrangement allows optimal operational redundancy and safety since each calculation module 124-126 is monitored by two independent control sub-modules $130_1$-$130_2$.

Figure 3:
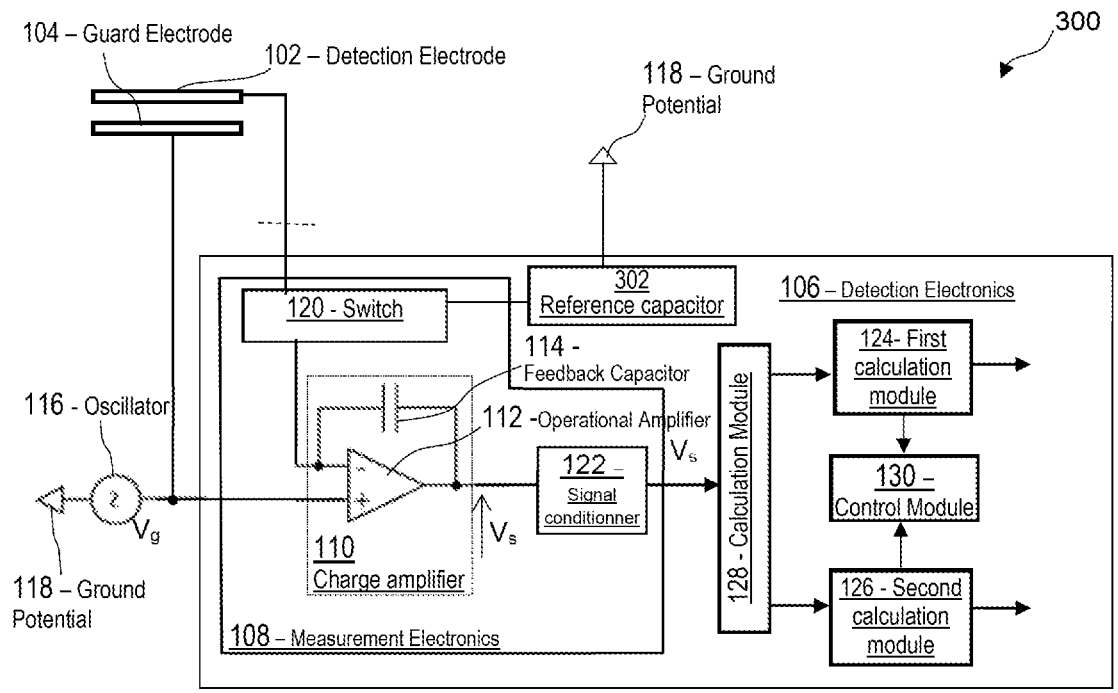

FIG. 3 is a diagrammatic representation of a third non-limitative embodiment example of a capacitive detection device according to the invention.

The detection device 300, shown in FIG. 3, comprises all the elements of the device 100 in FIG. 1.

The device 300, and in particular the detection electronics 106 of the device 300, also comprises a reference capacitance 302 which is used to carry out a calibration or a verification of the operation of the detection device 300, during a verification sequence.

The reference capacitance(s) is(are) connected to the inverting input of the charge amplifier 110 by virtue of the polling means 120, in order to carry out the verification sequence. In this case, all the detection electrodes 102 are connected to the guard potential. If the measured value of the reference capacitance 302 is correct then there is no failure to be signaled. In the opposite case, in particular if the measured value of the reference capacitance 302 is outside of a range of acceptable predefined values, the detection device 300 is faulty and the control module 130 signals this failure by an alarm signal or a safety signal. The measured value of the reference capacitance 302 can also be used, in so far as it is within the range of acceptable values, to carry out a calibration of the detection electronics 106.

The verification sequence can be carried out before or after each measurement sequence applied to a set of several detection electrodes 102, or before or after each measurement of a detection electrode 102.

Of course, the reference capacitance 302 can also be implemented in the device 200 in FIG. 2.

Figure 4:
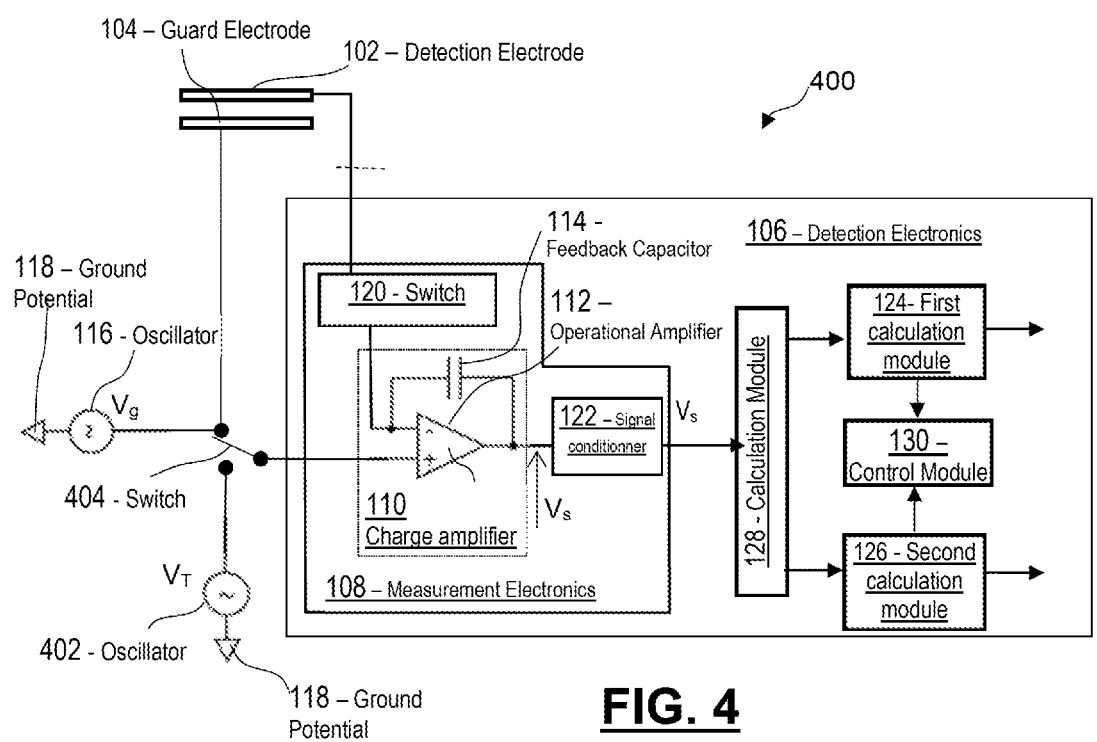

FIG. 4 is a diagrammatic representation of a fourth non-limitative embodiment example of a capacitive detection device according to the invention.

The detection device 400, shown in FIG. 4, comprises all the elements of the device 100 in FIG. 1.

The device 400 also comprises a second oscillator 402, referenced to the ground potential 118 and supplying an alternating potential $V_T$ identical to the guard potential $V_G$ but having a different amplitude, in particular a weaker amplitude.

The device 400 also comprises an electrical switch 404 making it possible to switch the polarization of the detection electrode 102 such that:

in a first position of the switch 404, shown in FIG. 4, the detection electrode 102 is polarized at the potential $V_G$; and in a second position of the switch 404, the detection electrode 102 is polarized at the potential $V_T$.

The device 400 makes it possible to use the guard electrode 104 as test electrode and to measure the capacitance, called test capacitance, denoted $C_T$, between the detection electrode 102 and the guard electrode 104. The value of the test capacitance $C_T$ being known, it is possible to detect a failure of the detection device 400.

The test capacitance $C_T$ can be measured during a verification sequence during which the detection electrode 102 is polarized with the potential $V_T$ by switching the switch 404 into its second position.

The verification sequence can be carried out before or after each measurement sequence applied to a set of several detection electrodes 102, or before or after each measurement of a detection electrode 102.

According to an alternative, the switch 404 can be used to modify the polarization of the guard electrode 104, in place of the detection electrode 102.

According to another alternative, the switch 404 can be omitted and replaced with a second oscillator 402 which supplies either the alternating potential $V_T$, or the excitation or guard potential $V_G$.

Of course, the device 400 can also utilize the reference capacitance 302 of the device 300. In this case, the verification sequence can carry out a measurement both of the test capacitances for the detection electrodes 102 and of the reference capacitance 302.

Figure 5:
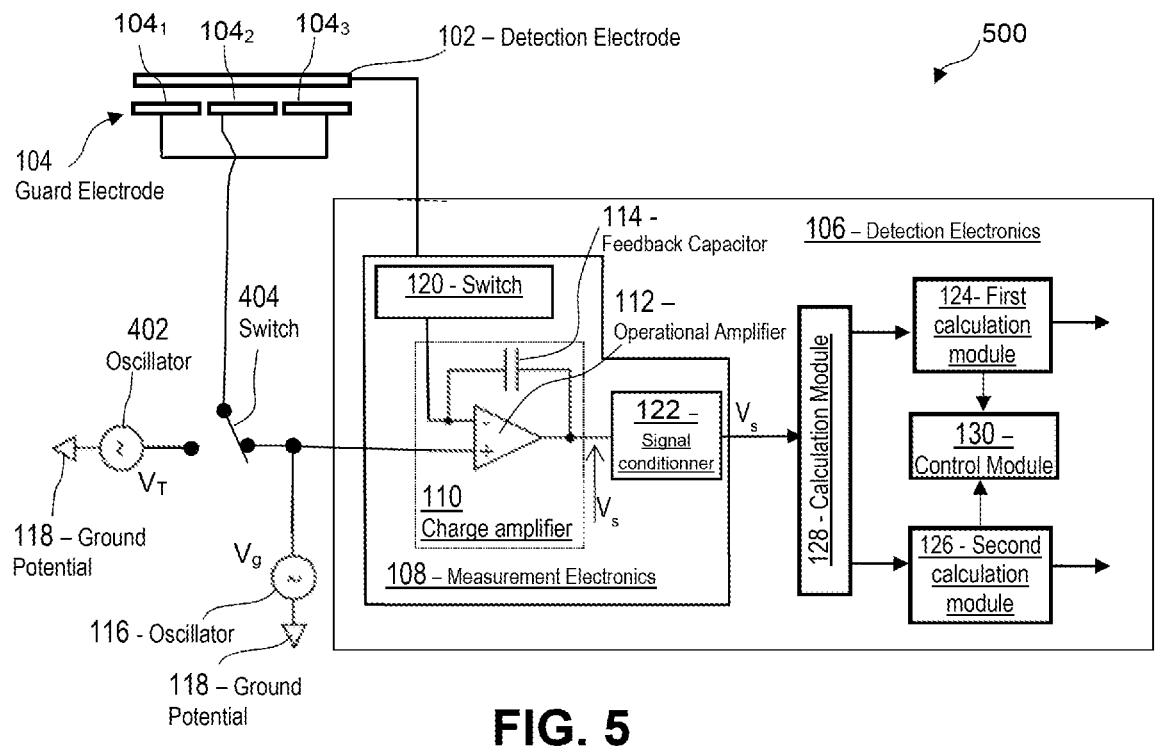

FIG. 5 is a diagrammatic representation of a fifth non-limitative embodiment example of a capacitive detection device according to the invention.

The detection device 500, shown in FIG. 5, comprises all the elements of the device 400 in FIG. 4.

In the device 500, unlike the device 400, the guard electrode 104 is produced in three independent parts: $104_1$-$104_3$.

The switch 404 is used to modify only the polarization of the part $104_2$ of the guard electrode 104. In particular, the electrical switch 404 makes it possible to switch the polarization of the part $104_2$ of the guard electrode 104 such that:

in a first position of the switch 404, shown in FIG. 5, the part $104_2$ of the guard electrode 104 is polarized at the potential $V_G$; and in a second position of the switch 404, the part $104_2$ of the guard electrode 104 is polarized at the potential $V_T$.

The other parts $104_1$ and $104_3$ of the guard electrode 104 are always polarized at the guard potential $V_G$.

The device 400 makes it possible, during a verification sequence, to use the part $104_2$ of the guard electrode 104 as test electrode and to measure the capacitance, called test capacitance, denoted $C_T$, between the detection electrode 102 and the part $104_2$ of the guard electrode 104. The value of the test capacitance $C_T$ being known, it is possible to detect a failure of the detection device 500. Of course:

the part $104_2$ of the guard electrode 104 forming a test electrode can be specific to one detection electrode 102, or common to several detection electrodes 102;

the device 500 can comprise one or a plurality of test electrodes formed respectively by one or a plurality of parts $104_2$ of guard electrode 104.

The verification sequence can be carried out before or after each measurement sequence applied to a set of several detection electrodes 102, or before or after each measurement of a detection electrode 102.

According to an alternative, the switch 404 can be omitted and replaced by a second oscillator 402 which supplies either the alternating potential $V_T$ or the excitation or guard potential $V_G$.

Of course, the device 400 can also utilize the reference capacitance 302 of the device 300. In this case, the verification sequence can carry out a measurement both of the test capacitances for the detection electrodes 102 and of the reference capacitance 302.

Each detection electrode 102 can be formed by one single measurement electrode.

Alternatively, each detection electrode 102 can be produced by several, and in particular two, measurement electrodes, capable of being polled by the detection electronics 106 in turn or sequentially. Thus, it is possible to obtain for each detection location, a redundant detection by virtue of several measurement electrodes.

FIGS. 6a-6e give five embodiment examples of a detection electrode that can be implemented in a capacitive detection device according to the invention.

Figure 6A:
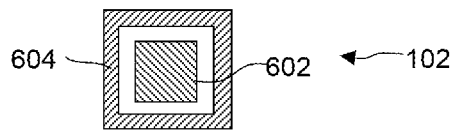
FIGS. 6a-6e are diagrammatic representations of embodiment examples of a capacitive detection electrode that can be implemented in a device according to the invention.

In FIG. 6a, the detection electrode 102 is formed by a first measurement electrode 602, entirely interleaved with a second measurement electrode 604. The second measurement electrode 604 completely surrounds the first measurement electrode 602. The connection tracks can then be produced on another layer of conductor.

Figure 6B:
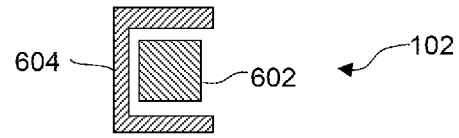

In FIG. 6b, the detection electrode 102 is formed by a first measurement electrode 602, entirely interleaved with a second measurement electrode 604. The second measurement electrode 604 does not completely surround the first measurement electrode 602 and has the form of a "C".

Figure 6C:
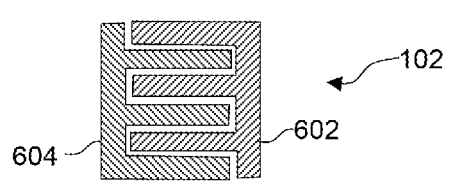

In FIG. 6c, the detection electrode 102 is formed by a first measurement electrode 602, and a second measurement electrode 604 which are interleaved with one another. Each measurement electrode has the shape of a comb. The combs are interleaved with one another.

Figure 6D:
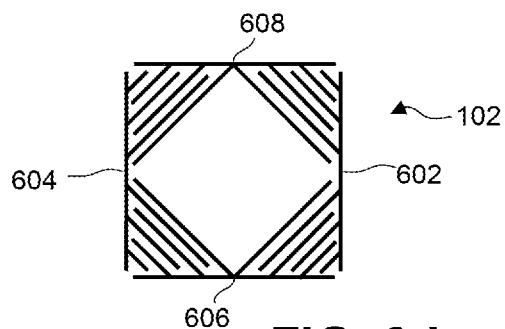

In FIG. 6d, the detection electrode 102 is formed by four measurement electrodes 602-608 which are interleaved with one another in threes. The measurement electrodes 602 and 604 are identical and face one another. The measurement electrodes 606 and 608 are identical and face one another.

Each measurement electrode is interleaved with the two measurement electrodes which are adjacent to it.

Figure 6E:
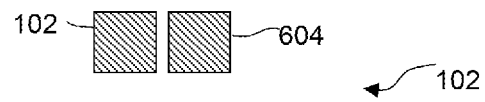

In FIG. 6e, the detection electrode 102 is formed by a first measurement electrode 602, juxtaposed with a second measurement electrode 604.

Figure 7:
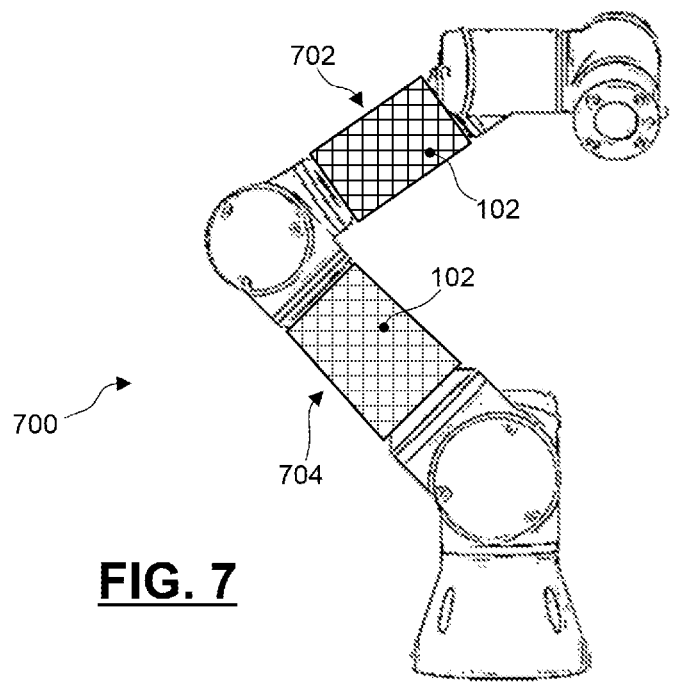
FIG. 7 is a diagrammatic representation of an embodiment example of a robot fitted with a detection device according to the invention.

FIG. 7 is a diagrammatic representation of a robot equipped with trim elements according to the invention.

The robot 700 shown in FIG. 7, is a robotized arm comprising several segments that are articulated and connected to one another by rotary articulations.

The robot 700 comprises two trim elements 702 and 704 placed on two segments of the robot 700.

Each trim element 702-704 comprises a detection device according to the invention, such as for example any one of the detection devices in FIGS. 1-5.

The detection electronics of the detection devices equipping the trim elements 702 and 704 that can be separate, or partially or completely common.

The detection electrodes 102 of each detection device equipping the trim elements trim 702-704 are integrated in the thickness of said trim element, or arranged on a face or the faces of said trim element 702-704.

The trim elements 702-704 also comprise a guard layer to avoid parasitic couplings between the detection electrodes and the structure of the robot.

The trim elements 702-704 are used either in place of an original trim element of the robot, or in addition to an original trim element.

Of course, the invention is not limited to the examples that have just been described, and numerous modifications may be made to these examples without exceeding the scope of the invention.

The invention claimed is:

1. A device for capacitive detection of an object with respect to a detection surface, comprising:
   at least one capacitive detection electrode; and
   electronics;
   detection electronics comprising at least one item of electronic equipment, called measurement electronics, for:
      polarizing said at least one detection electrode at an alternating potential (VG), called excitation potential, different from a ground potential;
      measuring a signal, called measurement signal, relative to a capacitance, called electrode-object capacitance, between each detection electrode and said object; and
   the detection electronics also comprises, for said at least one measurement electronics, at least one first and one second separate calculation modules, operating in parallel, and supplying at least two independent detection signals for one and the same measurement signal originating from the measurement electronics.

2. The device according to claim 1, characterized in that the detection electronics also comprises a control module arranged to compare the detection signals supplied by the first and second calculation modules.

3. The device according to claim 1, characterized in that the detection electronics comprises at least one capacitance, called reference capacitance, used to verify and/or calibrate the operation of the measurement electronics and/or of at least one calculation module.

4. The device according to claim 1, characterized in that it also comprises at least one electrode, called guard electrode, to guard at least one detection electrode, said at least one guard electrode being polarized at an alternating guard potential (VG) identical or substantially identical to the excitation potential at at least one working frequency, at least during measurement of a measurement signal relative to an electrode-object capacitance.

5. The device according to claim 4, characterized in that for at least one detection electrode, at least one test electrode is formed by a guard electrode, or a part of a guard electrode, associated with said detection electrode.

6. The device according to claim 1, characterized in that it comprises, for at least one detection electrode, at least one electrode, called test electrode, arranged to verify, during a verification sequence, the operation of said detection electrode by:
   polarizing said test electrode and said detection electrode at electrical potentials different to at least one working frequency, and
   measuring a signal relative to the capacitance, called test capacitance, between said test electrode and said detection electrode.

7. The device according to claim 6, characterized in that it comprises a means for modifying the polarization of the at least one test electrode, respectively of the at least one detection electrode, between a measurement sequence and a verification sequence, so as to polarize said at least one electrode:

during a verification sequence: at a first electrical potential (VT) different from the excitation potential (VG) at at least one working frequency, and during a measurement sequence: at a second alternating potential (VG), identical or substantially identical to said excitation potential at at least one working frequency, or corresponding to said excitation potential.

8. The device according to claim 7, characterized in that the first potential is one of:
the ground potential, or
a potential (VT) identical to the excitation potential, but having a different amplitude.

9. The device according to claim 1, characterized in that the at least one measurement electronics comprises a polling means to poll at least a part of the detection electrodes, sequentially.

10. The device according to claim 1, characterized in that the detection electronics is at least partially referenced electrically to the alternating excitation potential (VG).

11. The device according to claim 1, characterized in that each detection electrode carries out a capacitive detection for a detection location of the detection surface, at least one detection electrode comprising at least one first and one second independent electrodes, called measurement electrodes.

12. The device according to claim 11, characterized in that, for at least one detection electrode:

the first and second measurement electrodes are juxtaposed in a non-interleaved manner; or
one from the first and second measurement electrodes is at least partially interleaved with the other of said measurement electrodes; or
the first and second measurement electrodes are at least partially interleaved with one another.

13. A detection layer, for an item of equipment, fitted with a detection device according to claim 1.

14. The detection layer according to claim 13, characterized in that it comprises, along a face, a plurality of detection electrodes distributed according to a matrix arrangement.

15. The detection layer according to claim 13, characterized in that it comprises:
along a face, at least one detection electrode, and
along another face, at least one guard electrode and/or at least one test electrode.

16. The detection layer according to claim 13, characterized in that it has the form of a rigid or resilient trim element.

17. An item of equipment fitted with a detection layer according to claim 13.

18. An item of equipment fitted with a detection device according to claim 1.

19. The item of equipment according to claim 18, characterized in that it is a robot, a robotized handling arm or a robot segment.

* * * * *